(12) United States Patent
Ho

(10) Patent No.: US 7,508,702 B2
(45) Date of Patent: Mar. 24, 2009

(54) PROGRAMMING METHOD OF MAGNETIC RANDOM ACCESS MEMORY

(75) Inventor: Chia-Hua Ho, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 196 days.

(21) Appl. No.: 11/785,279

(22) Filed: Apr. 17, 2007

(65) Prior Publication Data

US 2008/0259679 A1    Oct. 23, 2008

(51) Int. Cl.
*G11C 11/14*    (2006.01)
(52) U.S. Cl. ........................ 365/171; 365/173
(58) Field of Classification Search ................ 365/171, 365/173, 157, 158
See application file for complete search history.

(56) References Cited

U.S. PATENT DOCUMENTS

| | | | | |
|---|---|---|---|---|
| 6,097,626 A | * | 8/2000 | Brug et al. ................ | 365/171 |
| 6,909,630 B2 | * | 6/2005 | Tsang ........................ | 365/158 |
| 7,009,873 B2 | * | 3/2006 | Yoda et al. ................ | 365/158 |
| 7,307,874 B2 | * | 12/2007 | Jeong et al. ................ | 365/158 |
| 7,369,728 B1 | * | 5/2008 | Hasegawa et al. ........... | 385/52 |
| 7,453,720 B2 | * | 11/2008 | Ju et al. .................... | 365/158 |
| 7,457,149 B2 | * | 11/2008 | Ho et al. ................... | 365/158 |

* cited by examiner

*Primary Examiner*—Tuan T Nguyen
*Assistant Examiner*—Hien N Nguyen
(74) *Attorney, Agent, or Firm*—Bacon & Thomas, PLLC

(57) ABSTRACT

A programming method of a magnetic random access memory (MRAM) is provided. The magnetic random access memory includes a first magnetic pinned layer, a second magnetic pinned layer and a magnetic free layer. The first magnetic pinned layer is pinned at a first magnetic direction. The second magnetic pinned layer is pinned at a second magnetic direction. The magnetic free layer is magnetized into the first magnetic direction or the second magnetic direction. The programming method includes the following steps. In the step (a), an additional magnetic field is applied onto the magnetic free layer. In the step (b), a first electron current is emitted through the magnetic free layer to magnetize the magnetic free layer into the first magnetic direction or the second magnetic direction.

10 Claims, 6 Drawing Sheets

PROGRAMMING METHOD OF MAGNETIC RANDOM ACCESS MEMORY

BACKGROUND OF THE INVENTION

1. Field of the Invention

The invention relates in general to a memory programming method, and more particularly to a programming method of a magnetic random access memory (MRAM).

2. Description of the Related Art

Along with the wide application of consumer electronic products, consumers develop higher and higher requirements of the memory including the power consumption, the cost, read/write speed and the erasing times. Therefore, several new invention memories are presented to fit the needs of different market segmentations with an aim to break through the current memory restrictions and become the mainstream technology for the new generation memory.

Examples of current memories include dynamic random access memory (DRAM), flash memory (Flash Memory), static random access memory (SRAM) and magnetic random access memory (MRAM). The magnetic random access memory (MRAM) is a new invention non-volatile memory, having the same non-volatile characteristics as that of the flash memory. Moreover, the magnetic random access memory (MRAM) is comparable to the static random access memory (SRAM) in terms of read/write speed. The unit memory area of the magnetic random access memory (MRAM) is further comparable to that of the dynamic random access memory (DRAM). Therefore, the magnetic random access memory has been accepted as a new generation memory with high potentials.

In the magnetic random access memory (MRAM), data are programmed through the spin-transferring of current or electron current. During the process programming data, the density of the current needs to be reach $10^6 \sim 10^7$ A/cm² so as to change the magnetic-resistance of the memory cell, not only increasing the power consumption of the memory but also incurring electron migration. Consequently, the operating efficiency and quality of the memory are affected. Therefore, how to effectively reduce the density of the current during the process of programming the magnetic random access memory has become an imminent issue to be resolved.

SUMMARY OF THE INVENTION

The invention is directed to a programming method of a magnetic random access memory (MRAM). The programming method changes the magnetic direction of the magnetic free layer through an additional magnetic field and a first electron current. During the programming process of the magnetic random access memory, the first electron current is largely reduced through the additional magnetic field, not only reducing the power consumption of the magnetic random access memory but also avoiding electronic migration, such that the operating efficiency of the magnetic random access memory is largely increased.

According to a first aspect of the present invention, a programming method of a magnetic random access memory (MRAM) is provided. The magnetic random access memory includes a first magnetic pinned layer, a second magnetic pinned layer and a magnetic free layer. The first magnetic pinned layer is pinned at a first magnetic direction. The second magnetic pinned layer is pinned at a second magnetic direction. The magnetic free layer is magnetized into the first magnetic direction or the second magnetic direction. The programming method includes the following the steps. In the step (a), an additional magnetic field is applied onto the magnetic free layer. In the step (b), a first electron current is emitted through the magnetic free layer to magnetize the magnetic free layer into the first magnetic direction or the second magnetic direction.

The invention will become apparent from the following detailed description of the preferred but non-limiting embodiments. The following description is made with reference to the accompanying drawings.

DETAILED DESCRIPTION OF THE INVENTION

The invention is exemplified by an embodiment below. However, the technology of the invention is not limited to the embodiment. The embodiment is used for elaborating purpose not for limiting the scope of protection of the invention. Moreover, secondary elements are omitted in the embodiment to highlight the technical features of the invention.

Figure 1:
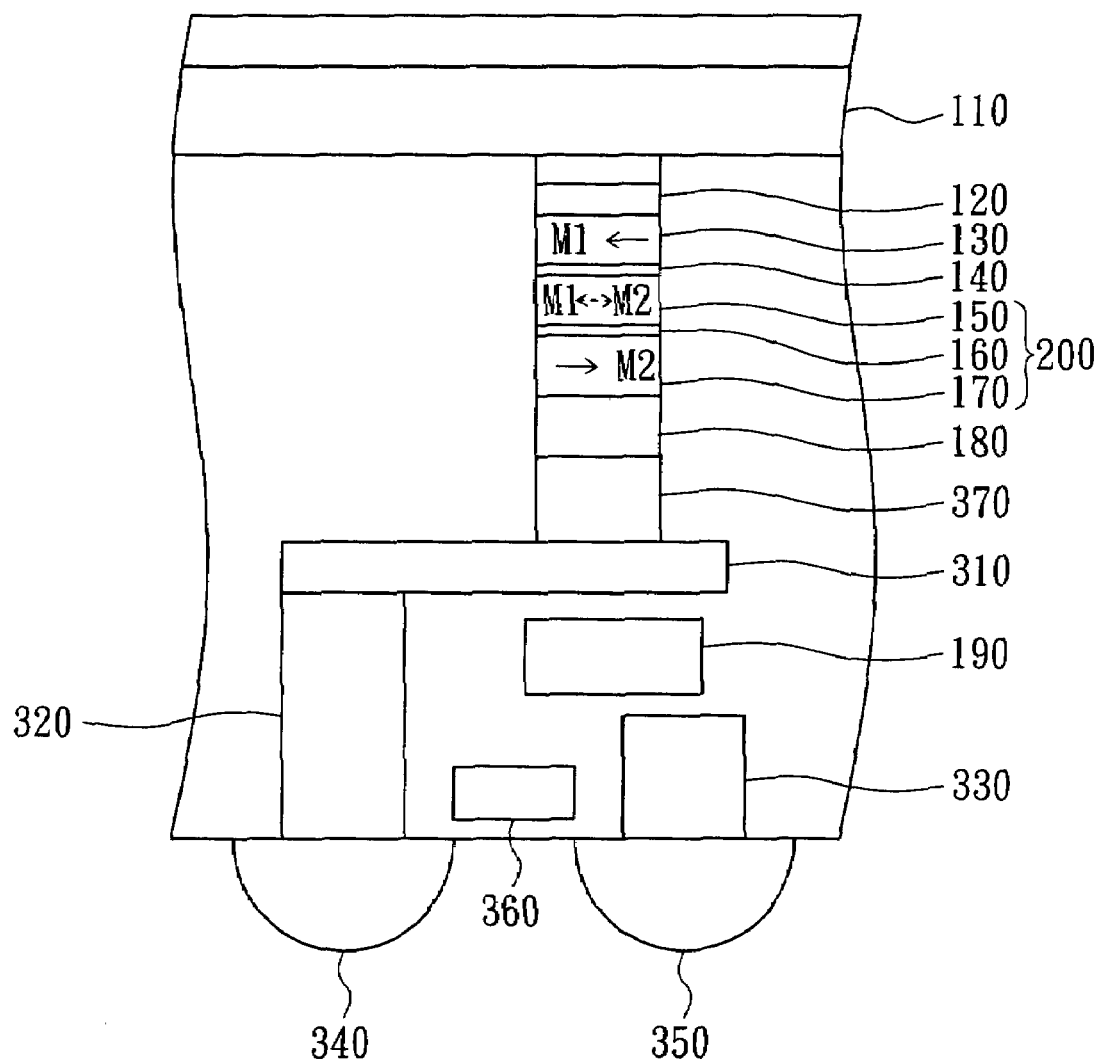
FIG. 1 is a perspective of a magnetic random access memory according to a preferred embodiment of the invention.
Figure 2:
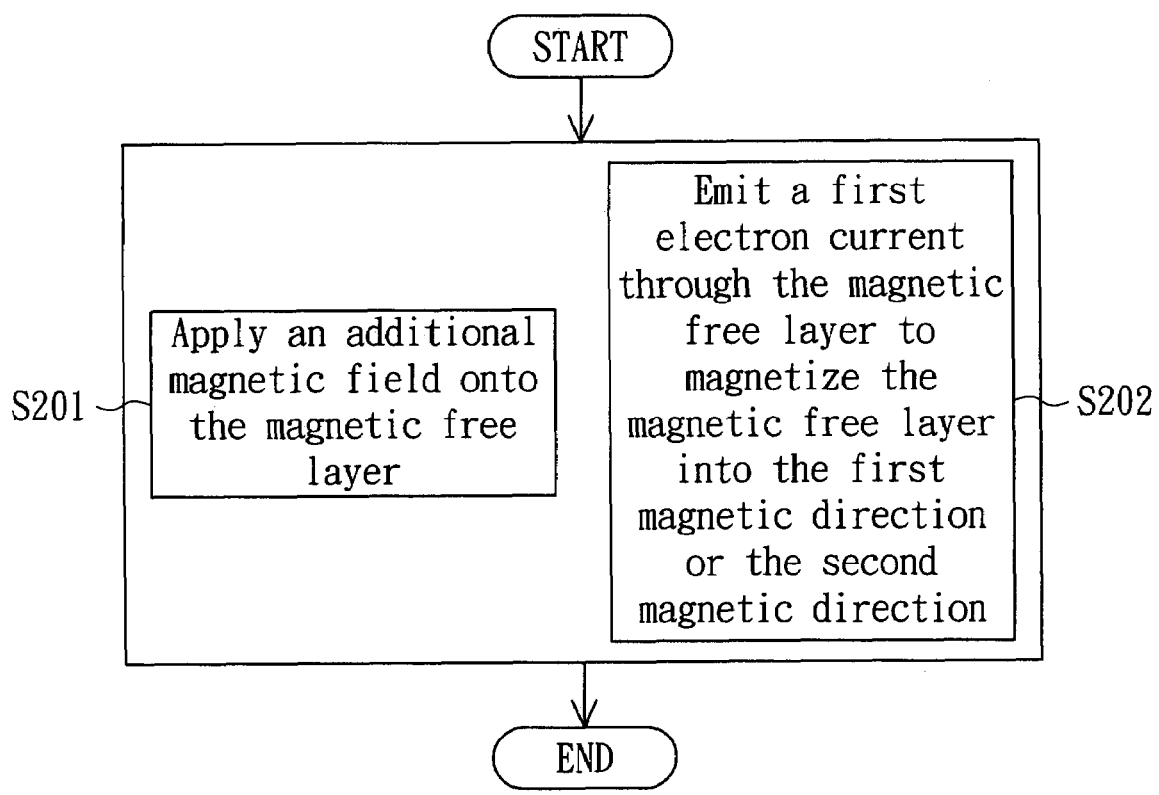
FIG. 2 is a flowchart of a programming method of a magnetic random access memory according to a preferred embodiment of the invention.

Referring to both FIG. 1 and FIG. 2. FIG. 1 is a perspective of a magnetic random access memory 100 according to a preferred embodiment of the invention. FIG. 2 is a flowchart of a programming method of a magnetic random access memory 100 according to a preferred embodiment of the invention. As indicated in FIG. 1, the magnetic random access memory 100 at least includes a first magnetic pinned layer 130, a second magnetic pinned layer 170 and a magnetic free layer 150. The first magnetic pinned layer 130 is pinned at a first magnetic direction M1. The second magnetic pinned layer 170 is pinned at a second magnetic direction M2.

The magnetic free layer 150 is magnetized into the first magnetic direction M1 or the second magnetic direction M2. In FIG. 1, the magnetic direction of the magnetic free layer 150 is denoted by dotted line and can be magnetized into either of the first magnetic direction M1 and the second magnetic direction M2.

The magnetic random access memory 100 further includes a spacer layer 160 disposed between the second magnetic pinned layer 170 and the magnetic free layer 150. The thickness of the spacer layer 160 approximately ranges between 0.7 nanometer (nm)~3 nanometer (nm), such that electrons can tunnel through the spacer layer 160. The second magnetic pinned layer 170, the magnetic free layer 150 and the spacer layer 160 form a magnetic tunnel junction (MTJ) 200. In the magnetic tunnel junction 200, when the magnetic direction of the second magnetic pinned layer 170 is different from the magnetic direction of the magnetic free layer 150, the magnetic tunnel junction 200 has a large resistance. To the contrary, when the magnetic direction of the second magnetic pinned layer 170 is the same with the magnetic direction of the magnetic free layer 170, the magnetic tunnel junction 200 has a small resistance. The large resistance and the small resistance respectively denote "0" and "1". By changing the magnetic direction of the magnetic free layer 150, "0" or "1" can be programmed to the magnetic random access memory 100.

Moreover, the magnetic random access memory 100 further comprises a bottom conductive layer 370, a bottom contact layer 310, a first conductive layer 320, a second conductive layer 330, a drain area 340, a source area 350 and a gate area 360. The gate area 360 is located between the drain area 340 and the source area 350. The second conductive layer 330 is electrically connected to the source area 350. The second anti-ferromagnetic layer 180 is electrically connected to the drain area 340 via the bottom conductive layer 370, the bottom contact layer 310 and the first conductive layer 320.

The magnetic random access memory 100 further includes a first anti-ferromagnetic layer 120, a second anti-ferromagnetic layer 180 and a barrier layer 140. The first anti-ferromagnetic layer 120 is adjacent to the first magnetic pinned layer 130 for fixing the first magnetic pinned layer 130 at the first magnetic direction M1. The second anti-ferromagnetic layer 180 is adjacent to the second magnetic pinned layer 170 for fixing the second magnetic pinned layer 170 at the second magnetic direction M2. The barrier layer 140 is disposed between the first magnetic pinned layer 130 and the magnetic free layer 150 for avoiding the magnetic interference between the first magnetic pinned layer 130 and the magnetic free layer 150.

As disclosed above, "0" or "1" can be programmed into the magnetic random access memory 100 by changing the magnetic direction of the magnetic free layer 150. The programming process is elaborated in a flowchart and perspectives of each the step.

Referring to FIG. 2, a flowchart of a programming method of a magnetic random access memory according to a preferred embodiment of the invention is shown. The programming method of the magnetic random access memory 100 at least includes the step S201 and the step S202. In the step S201, an additional magnetic field MF is applied onto the magnetic free layer 150 (the additional magnetic field MF is illustrated in FIG. 3B and FIG. 4B). In the step S202, a first electron current E1 is emitted through the magnetic free layer 150 to magnetize the magnetic free layer 150 into the first magnetic direction M1 or the second magnetic direction M2. In the present embodiment of the invention is exemplified by an electron current and the flowing direction thereof. The present embodiment of the invention can also be exemplified by a current and the opposite flowing direction. When the magnetic free layer 150 is magnetized into the first magnetic direction M1, the magnetic direction of the second magnetic pinned layer 170 is different from the magnetic direction of the magnetic free layer 150. Therefore, the magnetic tunnel junction 200 has a large resistance, and denotes "0". When the magnetic free layer 150 is magnetized into the second magnetic direction M2, the magnetic direction of the second magnetic pinned layer 170 is the same with the magnetic direction of the magnetic free layer 150. Therefore, the magnetic tunnel junction 200 has a small resistance, and denotes "1".

In the present embodiment of the invention, the programming method of the magnetic random access memory 100 performs the step S201 and the step S202 at the same time. With the assistance of the step S201, the first electron current E1 can be further reduced during the step S202, largely improve the convenience of operation. However the programming method of the magnetic random access memory 100 is not limited thereto, it is within the scope of the invention that at least part of the performing period of the step S201 and at least part of the performing period of the step S202 are overlap.

In the present embodiment of the invention, the magnetic random access memory 100 further includes a first word line 110 and a second word line 190. The first word line 110 is electrically connected to the first anti-ferromagnetic layer 120. The second word line 190 is electrically isolated from the first anti-ferromagnetic layer 120, the first magnetic pinned layer 130, the barrier layer 140, the magnetic free layer 150, the spacer layer 160, the second magnetic pinned layer 170 and the second anti-ferromagnetic layer 180. The step S201 and the step S202 are driven by the first word line 110 and the second word line 190 respectively. To further elaborate the programming method of the invention, the following explanation is accompanied by FIG. 2 and detailed flowchart of each the step are disclosed to further elaborate the process of programming "0" and "1" to the magnetic random access memory.

Figure 3A:
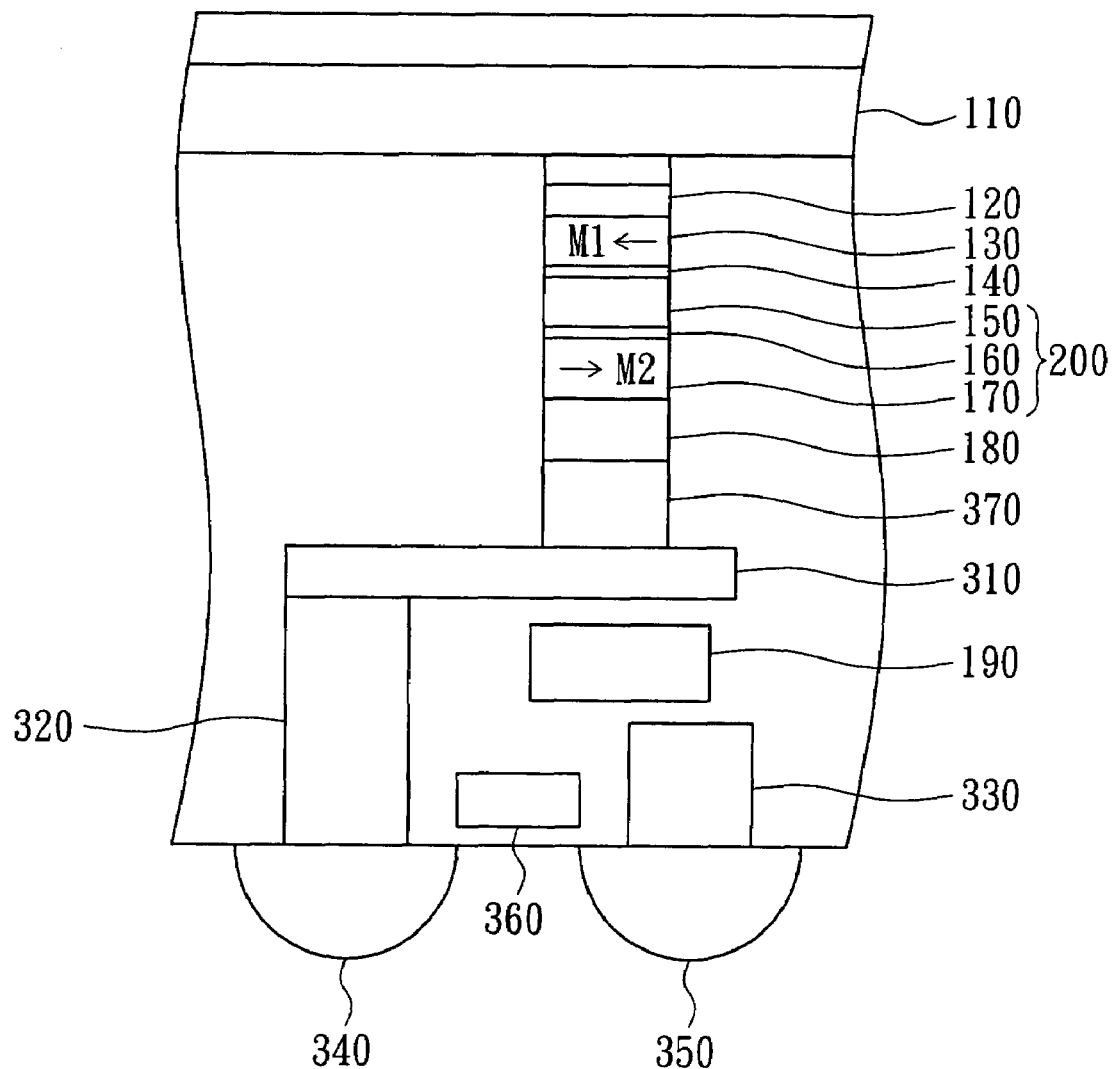
FIGS. 3A~3B illustrate the process of programming "0" according to a magnetic random access memory.
Figure 3B:
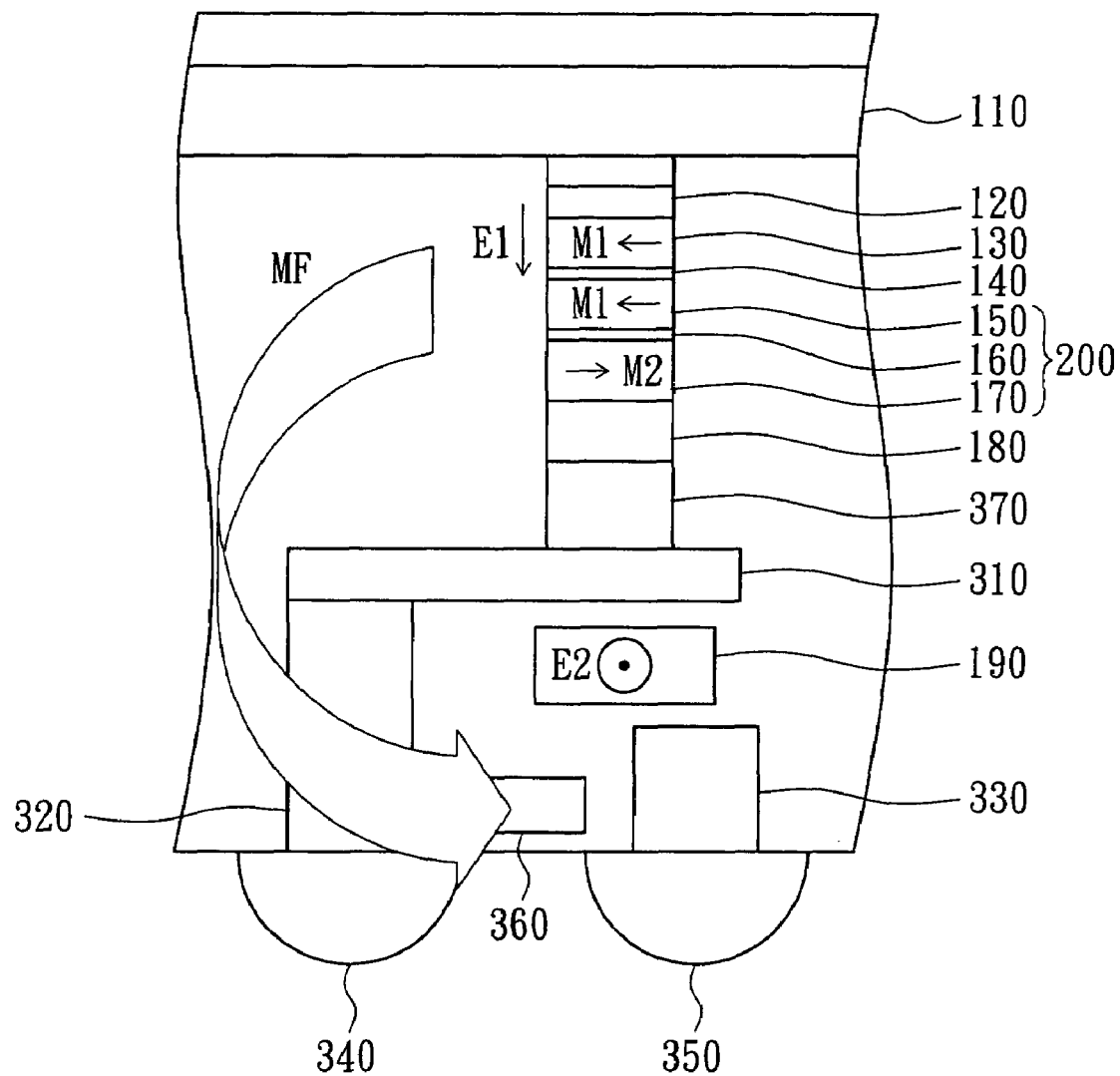

Referring to FIGS. 3A~3B, the process of programming "0" according to a magnetic random access memory 100 is illustrated. As indicated in FIG. 3A, no matter the magnetic random access memory 100 is at the state of "0" or "1", "0" can be programmed to the magnetic random access memory 100 through the step S201 and the step S202 of FIG. 2.

Next, as indicated in FIG. 3B, the second electron current E2 is controlled to flow through the second word line 190 in a first direction (the incident direction). When the second electron current E2 flows through the second word line 190, an additional magnetic field MF is generated around the second word line 190, wherein the direction of the additional magnetic field MF is the same with the direction of the first magnetic direction M1.

Meanwhile, the first electron current E1 is forced to the first word line 110. The first electron current E1 flows through the magnetic free layer 150 from the first magnetic pinned layer 130, such that the magnetic free layer 150 is magnetized into the first magnetic direction M1. Therefore, in the magnetic tunnel junction 200, when the magnetic direction of the second magnetic pinned layer 170 is different from the magnetic direction of the magnetic free layer 150, the magnetic tunnel junction 200 has a large resistance. That is, "0" is programmed to the magnetic random access memory 100 through the step S201 and the step S202.

The additional magnetic field MF generated by the second electron current E2 is not used for magnetizing the magnetic direction of the magnetic free layer 150, but is used for assisting the magnetic free layer 150 to magnetize the magnetic direction. Therefore, the additional magnetic field MF only needs to be the same with the direction to be magnetized by the magnetic free layer 150 and does not need to be larger than the coercivity field of the magnetic free layer 150. In the present embodiment of the invention, the coercivity field of the magnetic free layer 150 is approximately equal to 50 Oersteds (Oe), and the additional magnetic field MF only needs to be 15 Oe.

When the magnetic random access memory 100 is at the programming mode, the critical electron current density $j_c$ of first electron current E1 can be obtained according to the following formulas:

$$j_c = J_{c0}\left(1 - \frac{kT}{E}\ln\left(\frac{\tau_p}{\tau_0}\right)\right); \tag{1}$$

$$E = \frac{M_s V H_k}{2}$$

wherein, T denotes temperature, $\tau_p$ denotes programming pulse time, $\tau_0$ denotes critical pulse time, $J_{c0}$ denotes constant, E denotes energy, $M_s$ denotes saturation magnetization, V denotes total volume, and $H_k$ denotes anisotropic energy. Formulas (1) can further be converted to obtain another formulas expressed as:

$$j_c = \left(\frac{2e}{\hbar}\right)\left(\frac{\alpha}{\eta}\right)VM_s(H + H_k + 2\pi M_s) \tag{2}$$

wherein, e, α and ℏ are constant, η denotes magnetic polarization of ferromagnetic material, and H denotes the energy of the additional magnetic field MF.

Formulas (2) can be further simplified as:

$$j_c \propto C_1(H+C_2) \quad (3)$$

wherein, $C_1$ and $C_2$ are constant. That is, the energy H of the additional magnetic field MF is proportional to the critical electron current density $j_c$ of the first electron current E1. In the present embodiment of the invention, during the process of programming "0" to the magnetic random access memory 100, through the operation of the step S201 and the step S202, the effect of the energy H of the additional magnetic field MF is added to the critical electron current density $j_c$ of the first electron current E1. Therefore, during the programming process of the magnetic random access memory 100, the load of the first electron current E1 of the first word line 110 is largely reduced.

Figure 4A:
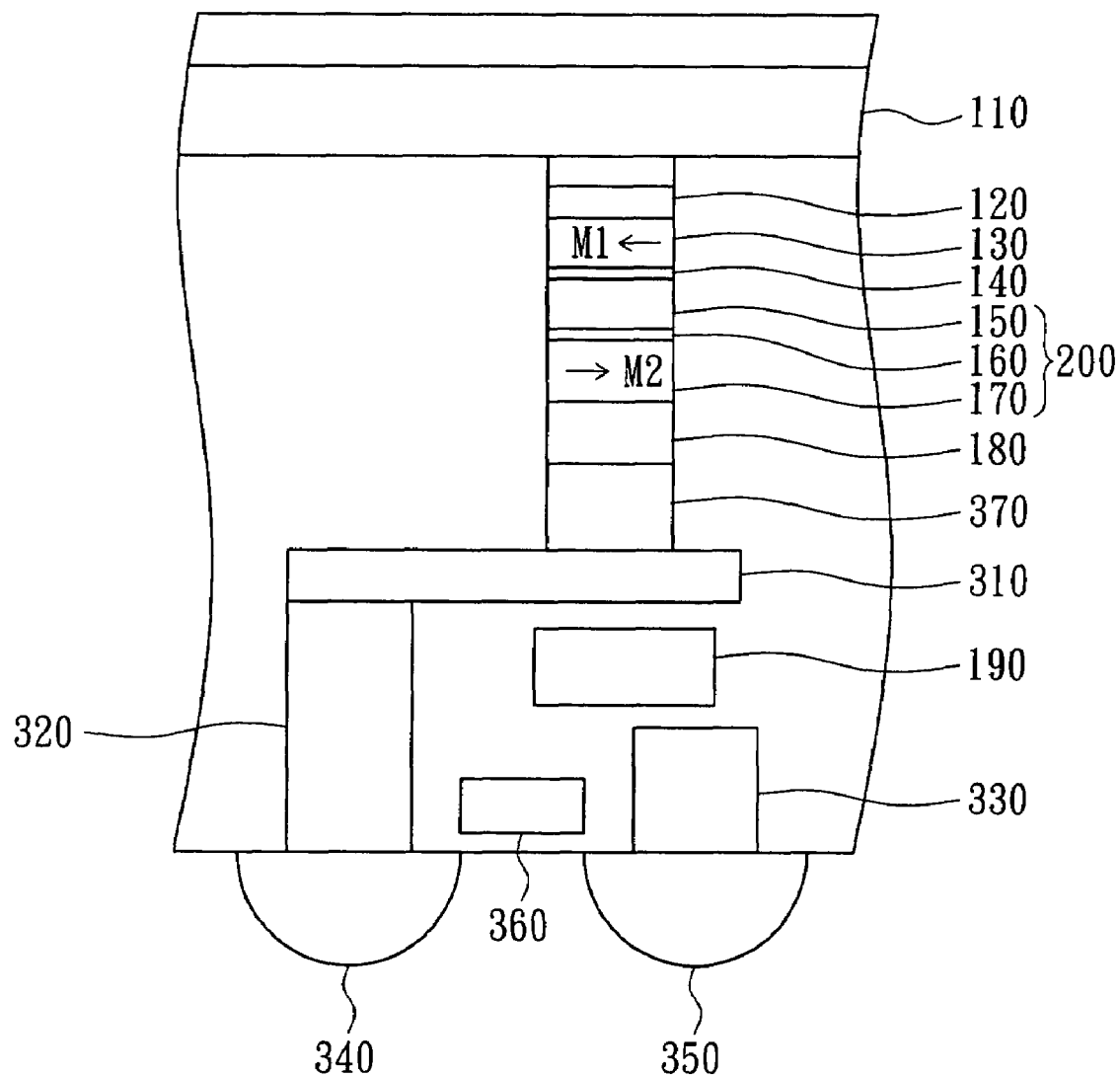
FIGS. 4A~4B illustrate the process of programming "1" according to a magnetic random access memory.
Figure 4B:
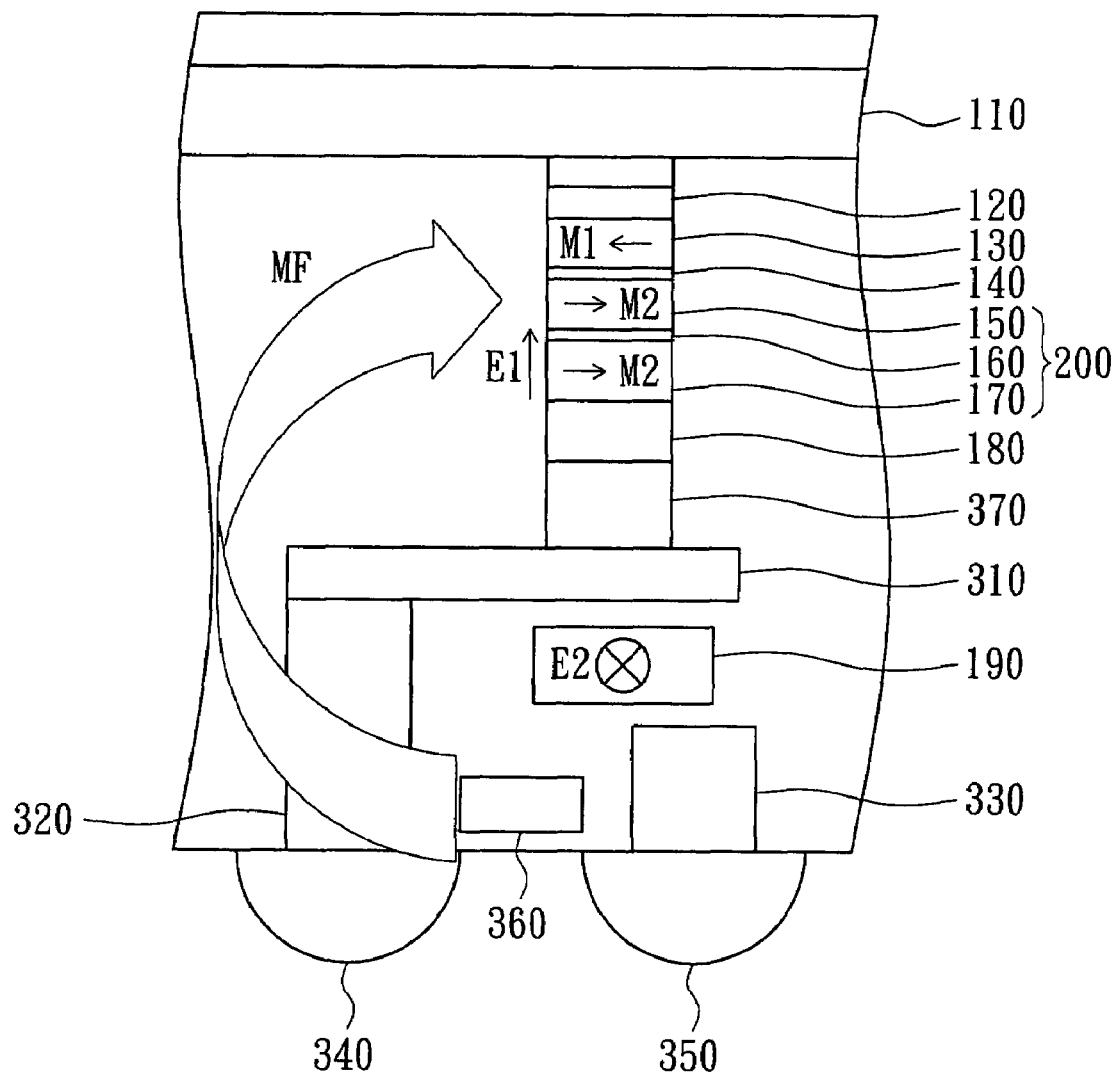

Referring to FIGS. 4A~4B, the process of programming "1" according to a magnetic random access memory 100 is illustrated. On the other hand, as indicated in FIG. 4A, no matter the magnetic random access memory 100 is at the state of "0" or "1", "1" can be programmed to the magnetic random access memory 100 through the step S201 and the step S202 of FIG. 2.

Next, as indicated in FIG. 4B, the second electron current E2 is controlled to flow through the second word line 190 at a second direction (the outgoing direction). When the second electron current E2 flows through the second word line 190, an additional magnetic field MF is generated around the second word line 190, wherein the direction of the additional magnetic field MF is the same with the direction of the second magnetic direction M2.

Meanwhile, the first electron current E1 is forced to the first word line 110. The first electron current E1 flows through the magnetic free layer 150 from the second magnetic pinned layer 170, such that the magnetic free layer 150 is magnetized into the second magnetic direction M2. Therefore, in the magnetic tunnel junction 200, when the magnetic direction of the second magnetic pinned layer 170 is the same with the magnetic direction of the magnetic free layer 150, the magnetic tunnel junction 200 has a small resistance. That is, "1" is programmed to the magnetic random access memory 100 through the step S201 and the step S202.

The additional magnetic field MF generated by the second electron current E2 is not used for magnetizing the magnetic direction of the magnetic free layer 150, but is used for assisting the magnetic free layer 150 to magnetize the magnetic direction. Therefore, the additional magnetic field MF only needs to the same with the direction to be magnetized by the magnetic free layer 150 and does not need to be larger than the coercivity field of the magnetic free layer 150. In the present embodiment of the invention, the coercivity field of the magnetic free layer 150 is approximately equal to 50 Oersteds (Oe), and the additional magnetic field MF only needs to be 15 Oe.

Likewise, in the present embodiment of the invention, during the process of programming "1" to the magnetic random access memory 100, through the operation of the step S201 and the step S202, the effect of the energy H of the additional magnetic field MF is added to the critical electron current density $j_c$ of the first electron current E1. Therefore, during the programming process of the magnetic random access memory 100, the load of the first electron current E1 of the first word line 110 is largely reduced.

Despite the magnetic random access memory 100 of the invention preferred embodiment is exemplified by FIG. 1, however the structure of the magnetic random access memory 100 is not limited thereto, and the material and thickness of each layer of the magnetic random access memory 100 are not limited to any particular material and thickness.

For example, the first anti-ferromagnetic layer 120 and the second anti-ferromagnetic layer 180 can be made from an anti-ferromagnetic material, such as ferro-manganese (FeMn) or manganese-platinum (PtMn) with the thickness of 10 nm~200 nm The first magnetic pinned layer 130 and the second magnetic pinned layer 170 can be made from a ferromagnetic material or anti-ferromagnetic material. Examples of the ferromagnetic material include ferro-cobalt (CoFe), ferro-nickel (NiFe), platinum-cobalt (CoPt), ferro-cobalt-boron (CoFeB), ferro-cobalt/ferro-nickel stacked structure (CoFe/NiFe) and ferro-nickel/ferro-cobalt-boron stacked structure (NiFe/CoFeB). Examples of the anti-ferromagnetic material include ferro-cobalt-boron/ruthenium/ferro-cobalt-boron stacked structure (CoFeB/Ru/CoFeB) and ferro-cobalt/ruthenium/ferro-cobalt stacked structure (CoFe/Ru/CoFe).

The spacer layer 160 can be made from aluminum oxide (Al2O3) or manganese oxide (MgO) with the thickness of 0.7 nm~3 nm.

The magnetic free layer 150 can be made from ferromagnetic material. Examples of the ferromagnetic material include ferro-cobalt (CoFe), ferro-nickel (NiFe), platinum-cobalt (CoPt), ferro-cobalt-boron (CoFeB), ferro-cobalt/ferro-nickel stacked structure (CoFe/NiFe) and ferro-nickel/ferro-cobalt-boron stacked structure (NiFe/CoFeB) with the thickness of 1 nm~20 nm.

According to the programming method of the magnetic random access memory 100 disclosed in the above embodiment of the invention, the magnetic direction of the magnetic free layer 150 is changed through the additional magnetic field MF and the first electron current E1. During the process of programming the magnetic random access memory 100, with the assistance of the additional magnetic field MF, the load of the first electron current E1 is largely reduced, not only reducing the power consumption of the magnetic random access memory 100, but also avoiding electronic migration, such that the operating efficiency of the magnetic random access memory 100 is largely improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A programming method of a magnetic random access memory (MRAM), wherein the magnetic random access memory comprises a first magnetic pinned layer, a second magnetic pinned layer and a magnetic free layer, the first magnetic pinned layer is pinned at a first magnetic direction, the second magnetic pinned layer is pinned at a second magnetic direction, the magnetic free layer is magnetized into the first magnetic direction or the second magnetic direction, the programming method comprises:

(a) applying an additional magnetic field onto the magnetic free layer; and
   (b) emitting a first electron current through the magnetic free layer to magnetize the magnetic free layer into the first magnetic direction or the second magnetic direction.

2. The programming method of a magnetic random access memory according to claim 1, wherein in the step (a), the additional magnetic field is far smaller than the coercivity field of the magnetic free layer.

3. The programming method of a magnetic random access memory according to claim 2, wherein in the step (a), the additional magnetic field is smaller than the coercivity field of the magnetic free layer by 50 Oersteds (Oe).

4. The programming method of a magnetic random access memory according to claim 2, wherein in the step (a), the additional magnetic field is smaller than one third of the coercivity field of the magnetic free layer.

5. The programming method of a magnetic random access memory according to claim 1, wherein in the step (a), the direction of the additional magnetic field is the same with the direction to be magnetized by the magnetic free layer.

6. The programming method of a magnetic random access memory according to claim 1, wherein the magnetic random access memory further comprises a second word line, the step (a) emits a second electron current through the second word line to form the additional magnetic field.

7. The magnetic random access memory programming method according to claim 6, wherein the step (a) further comprises:
 (a1) controlling the second electron current to flow through the second word line in a first direction, such that the direction of the additional magnetic field is the same with the first magnetic direction; or
 (a2) controlling the second electron current to flow through the second word line in a second direction, such that the direction of the additional magnetic field is the same with the second magnetic direction.

8. The programming method of a magnetic random access memory according to claim 1, wherein the step (b) further comprises:
 (b1) controlling the first electron current to flow through the magnetic free layer from the first magnetic pinned layer, such that the magnetic free layer is magnetized into the first magnetic direction; or
 (b2) controlling the first electron current to flow through the magnetic free layer from the second magnetic pinned layer, such that the magnetic free layer is magnetized into the second magnetic direction.

9. The programming method of a magnetic random access memory according to claim 1, wherein the step (a) and the step (b) are performed at the same time.

10. The programming method of a magnetic random access memory according to claim 1, wherein at least part of the performing period of the step (a) and at least part of the performing period of the step (b) are overlap.

* * * * *